US012784814B2

(12) United States Patent
Riley et al.

(10) Patent No.: US 12,784,814 B2
(45) Date of Patent: Nov. 3, 2026

(54) REGISTER FILE ARRAYS WITH MULTIPLEXED READ PATH CIRCUITRY

(71) Applicant: Intel Corporation, Santa Clara, CA (US)

(72) Inventors: John R. Riley, Hillsboro, OR (US); Anandraj Devarajan, Austin, TX (US); Feroze Merchant, Austin, TX (US); Amlan Ghosh, Mebane, NC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/396,222

(22) Filed: Dec. 26, 2023

(65) Prior Publication Data

US 2024/0221825 A1 Jul. 4, 2024

Related U.S. Application Data

(60) Provisional application No. 63/436,367, filed on Dec. 30, 2022.

(51) Int. Cl.

*G11C 11/4096* (2006.01)
*G11C 11/408* (2006.01)
*G11C 11/4094* (2006.01)

(52) U.S. Cl.

CPC ...... *G11C 11/4096* (2013.01); *G11C 11/4085* (2013.01); *G11C 11/4094* (2013.01)

(58) Field of Classification Search

CPC ............ G11C 11/4096; G11C 11/4085; G11C 11/4094

See application file for complete search history.

(56) References Cited

U.S. PATENT DOCUMENTS 5,815,432 A 9/1998 Naffziger et al.
6,345,010 B2 * 2/2002 Shimazaki ............ G11C 11/419 365/207

(Continued)

FOREIGN PATENT DOCUMENTS

KR 10-2023-0004012 A 1/2023
WO 2020/255801 A1 12/2020

OTHER PUBLICATIONS

A. Khakifirooz et al., "The Future of High-Performance CMOS: Trends and Requirements," ESSDERC 2008—38th European Solid-State Device Research Conference, Sep. 2008, 8 pages.

(Continued)

*Primary Examiner* — Vanthu T Nguyen

(74) *Attorney, Agent, or Firm* — Nicholson De Vos; WEBSTER & ELLIOTT LLP

(57) ABSTRACT

Various embodiments provide apparatuses, systems, and methods for a register file array with a plurality of sets of memory cells, wherein individual sets of memory cells of the plurality of sets of memory cells are coupled to a respective local bit line (LBL). A merge circuitry may include a multiplexer with inputs coupled to the respective LBLs, wherein the multiplexer is to couple a selected one of the LBLs to a LBL merge node. Read circuitry may be coupled to the LBL merge node to read data from a first memory cell via the selected LBL. In some embodiments, the LBL may be precharged to a supply voltage (e.g., Vcc) minus a threshold voltage, Vt, of the multiplexer transistor, as opposed to being precharged to Vcc as in prior techniques. Other embodiments may be described and claimed.

18 Claims, 4 Drawing Sheets

(56) References Cited

U.S. PATENT DOCUMENTS

| | | | | |
|---|---|---|---|---|
| 7,684,232 | B1 | 3/2010 | Lesea | |
| 8,605,532 | B2 * | 12/2013 | Kajigaya | G11C 11/4097 365/185.21 |
| 9,496,032 | B2 * | 11/2016 | Kyung | G11C 13/0002 |
| 11,170,844 | B1 | 11/2021 | Doluca et al. | |
| 11,894,049 | B1 | 2/2024 | Asenov et al. | |
| 2006/0250880 | A1 | 11/2006 | Ramaraju et al. | |
| 2013/0235681 | A1 | 9/2013 | Behrends et al. | |
| 2014/0063919 | A1 | 3/2014 | Liaw | |
| 2014/0098596 | A1 | 4/2014 | Poulton et al. | |
| 2015/0043270 | A1 | 2/2015 | Singh et al. | |
| 2016/0181257 | A1 | 6/2016 | Liaw | |
| 2021/0343332 | A1 | 11/2021 | Chiu et al. | |
| 2022/0093613 | A1 | 3/2022 | Moriwaki | |
| 2022/0108742 | A1 | 4/2022 | Li et al. | |
| 2023/0284427 | A1 | 9/2023 | Augustine et al. | |
| 2024/0005982 | A1 | 1/2024 | Ghosh et al. | |
| 2024/0053987 | A1 | 2/2024 | Augustine et al. | |

OTHER PUBLICATIONS

Extended European Search Report, EP App. No. 24212981.5, Apr. 15, 2025, 12 pages.

Extended European Search Report, EP App. No. 25151737.1, Jun. 27, 2025, 10 pages.

International Search Report and Written Opinion, PCT App. No. PCT/US2024/021233, Dec. 17, 2024, 9 pages.

J. Ryckaert et al., "The Complementary FET (CFET) for CMOS scaling beyond N3," 2018 IEEE Symposium on VLSI Technology, Jun. 2018, 2 pages.

Non-Final Office Action, U.S. Appl. No. 17/963,313, Nov. 25, 2025, 16 pages.

R. Mathur et al., "Buried Bitline for sub-5nm SRAM Design," 2020 IEEE International Electron Devices Meeting (IEDM), Dec. 2020, 4 pages.

Toshiro Hiramoto, "Five nanometre CMOS technology," Nature Electronics, vol. 2, Dec. 2019, 2 pages.

Final Office Action, U.S. Appl. No. 17/963,313, Apr. 1, 2026, 17 pages.

Office Action, EP App. No. 24212981.5, Mar. 6, 2026, 6 pages.

* cited by examiner

REGISTER FILE ARRAYS WITH MULTIPLEXED READ PATH CIRCUITRY

CROSS REFERENCE TO RELATED APPLICATION

The present application claims priority to U.S. Provisional Patent Application No. 63/436,367, filed Dec. 30, 2022, which is hereby incorporated by reference herein.

BACKGROUND

To meet the ever-increasing requirements of higher clock frequency, yet low minimum operating voltage within a fixed power budget, it has become commonplace to design register file (RF) memory bitcells with large read port and low threshold voltage (VT) transistors to achieve fast read speed. At the same time, Level-1 cache capacity is growing from generation to generation to improve single-threaded performance for high-performance microprocessor. These large cache sizes with low VT transistors contribute to ever bigger percentage of leakage current while in idle condition. At the same time, current domino local read merge on register files does not allow more bits per bitline to achieve area efficiency without sacrificing the read performance as well as minimum operating voltage of the circuit.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
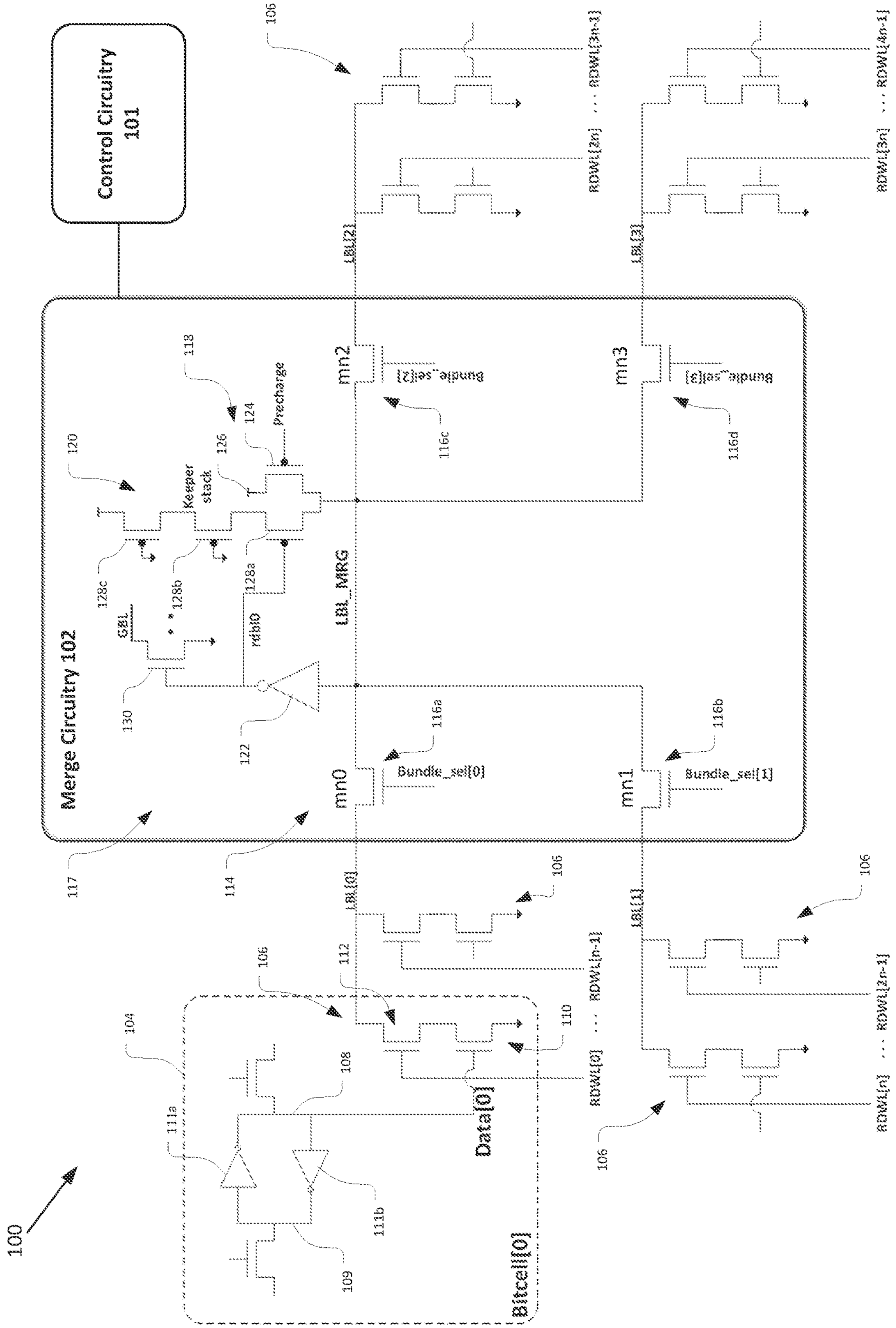
FIG. 1 schematically illustrates a register file (RF) circuitry in accordance with various embodiments herein.

Various embodiments herein provide merge circuitry in a read path of a register file array that may enable an increased number of bits per bitline and/or improved area, among other benefits. For example, the register file array may include a plurality of sets of memory cells, wherein individual sets of memory cells of the plurality of sets of memory cells are coupled to a respective local bit line (LBL). The merge circuitry may include a multiplexer with inputs coupled to the respective LBLs, wherein the multiplexer is to couple a selected one of the LBLs to a LBL merge node. Read circuitry may be coupled to the LBL merge node to read data from a memory cell, of the respective set of memory cells, via the selected LBL. The read circuitry may include a precharge circuit, a keeper circuit, and/or other suitable circuitry.

In embodiments, the multiplexer may utilize a flying bitline technique to couple the LBLs to respective transistors of the multiplexer. The mutliplexer may include n-type metal-oxide-semiconductor (NMOS) column multiplexer (mux) transistors. The other LBLs may be floating during the idle state and/or when another LBL is being read, which significantly reduces the leakage current through the read stack. Furthermore, the described techniques may improve RF read performance by pre-charging the LBL to a lower voltage than prior techniques. For example, the LBL may be precharged to a supply voltage (e.g., Vcc) minus a threshold voltage, Vt, of the multiplexer transistor. In aggregate, the embodiments herein may improve area, power, and/or performance of a register file circuit.

In some embodiments, the techniques described herein may be used in a register file array that provides a cache memory (e.g., level 1 cache or another cache level) for one or more processor cores. The cache memory may be implemented on a same integrated circuit die as the one or more processor cores. However, the techniques described herein may also be used for other types of memory circuitry, such as random access memory (RAM) and/or external memory circuitry.

Prior techniques have been developed to improve aspects of register file circuits. However, each also comes with drawbacks. For example, a first prior technique improves array efficiency by increasing the number of bits per local bitline at the cost of performance and minimum voltage (Vmin). This improves area, but is worse for power, performance, and Vmin.

A second prior technique improves read stack leakage by using pass-gate device in the local bitline of the read merge circuit during the idle cycle. This topology suffers from array inefficiency.

A third prior technique improves gated precharge devices to float the local bitline. This technique requires to tie down the output of the merge circuit to a known state. Additionally, the traditional stacked bitline keeper design must be replaced with bridge keeper or interrupted keeper.

A fourth prior technique uses a header or footer circuit with active or passive gate-controlled regulated supply with lower voltage headroom during the idle period. This technique reduces the leakage power consumption. However, it does not improve area or performance.

A fifth prior technique is to precharge to a reduced voltage than the supply voltage, which reduces the leakage current in the read stack.

Accordingly, the first prior technique improves area, but is worse for power, performance, and Vmin. The second, third, fourth, and fifth prior techniques improve power consumption, but do not improve area or performance; in fact, they are worse for area and performance due to the added power saving circuitry. In the second and third prior techniques, two sets of clock and data signals are required to selectively start and end precharge of the correct local bitlines. In the third prior technique, gating the NAND merge circuit degrades evaluation performance and may require lower threshold voltage devices in the merge circuitry to mitigate the performance degradation further increasing leakage power. This topology also requires additional circuitry to hold NAND output to ground while in idle phase to prevent any tristate output at the global evaluate input stage. To meet design of yield requirement with applied high sigma process variation and clock skew, it is very challenging to close on timing and may require more local interlock circuitry. Dynamic power requirement is higher as well due to multiple signal switching. Overall area requirement and lower performance trade-off may not make it a generic solution. In the fourth prior technique, complex wake logic and extra primary clock-like input or address with high setup time are needed to control the power gate devices, thereby significantly impacting read performance. Furthermore, all of these prior techniques have increased dynamic power while switching between different bitcell bundles.

In embodiments herein, the LBL node may combine a number of bitcells per bitline in a register file. The number of bitcells combined per bitline may be any suitable number, such as 32, 64, or another suitable number. Additionally, multiple LBLs may be combined with a multiplexer for a larger number of bitcells in one read merge circuit. The multiplexer may be coupled to any suitable number of LBLs, such as 2, 4, 8, and/or another suitable number. For example, in one embodiment, there may be 32 bits per LBL, and the multiplexer is coupled to four LBLs (e.g., a 4 to 1 mux) for a total of 4×32=128 entries in one read merge circuit. This effectively reduces the number of read precharge and keeper circuits for an array by a multiple of the number of LBLs that are merged (e.g., 4X for 4 LBLs) compared to the traditional implementation described earlier. Accordingly, the embodiments herein provide significant area savings at the array level.

Additionally, in embodiments herein, the LBLs may be kept in a floating state during an idle period and/or while another LBL is being read. In some prior techniques, local read bitlines for all the ports are held high in a precharged state during the idle period. Depending on the stored data in bitcells, all the read stack devices can be in a high leakage state. In a RF bitcell column with large number of entries (bitcells) and short bitlines, leakage power can be drastically high. In embodiments herein, this may be addressed by keeping the local read bitlines in a floating state until a read operation happens. Prior to a read operation, a decoded address signal triggers pre-charging of only the local read bitline which is going to be evaluated. All other local bitlines stay in the previous floating state.

An integrated circuit, e.g., central processing unit (CPU) and/or system-on-chip (SoC), may include numerous memory arrays, which may constitute ~25% or another suitable value of the total die area. The memory arrays may be, for example, 1 read port, 1 write port (1R1 W) and/or 2 read port, 1 write port (2R1 W) memory arrays and/or another suitable configuration. In some embodiments, the memory arrays may utilize 8 transistors (8T) (e.g., for 1R1 W) or 10 transistors (10T) (e.g., for 2R1 W) domino-read bitcells having dedicated read ports for improved performance and bitcell read-stability. Embodiments herein provide an area efficient low-power RF array with significant leakage reduction.

FIG. 1 shows an example implementation of a RF circuitry 100 in accordance with various embodiments. The RF circuitry 100 includes multiple LBLs (e.g., LBL[0], LBL[1], LBL[2], and LBL[3]) coupled to a merge circuitry 102. The LBLs may also be referred to as "local read bitlines" since they are part of the read path. The RF circuitry 100 may further include control circuitry 101 to control operation of the RF circuitry 100. For example, the control circuitry 101 may provide one or more of the control signals described herein (e.g., bundle select signal, precharge signal, read wordline signal, etc.).

Each LBL is coupled to a plurality of bitcells 104 (e.g., n bitcells) via respective read ports 106 of the bitcell. The bitcell 104 may store a bit of data (Data[0]) at a bit node 108 and an opposite logical value (bit bar) at a bit bar node 109. The logic values of the bit node 108 and bit bar node 109 may be maintained by opposing inverters 111*a-b* (also referred to as storage logic). For ease of understanding, only one bitcell 104 (bitcell[0]) is shown in FIG. 1 to include the storage logic. However, it will be apparent that the other read ports 106 are also coupled to respective storage logic. Additionally, the bitcell 104 may include additional and/or different components, such as write circuitry, a different configuration, etc.

The read port 106 may include a first transistor 110 and a second transistor 112. The gate of the first transistor 110 may be coupled to the data node 108 of the bitcell 104 to receive the data to be read (e.g., Data[0]). The gate of the second transistor 112 may receive a respective read wordline signal (e.g., RDWL[0]). Additionally, the first transistor 110 may be coupled between the second transistor 110 and ground, and the second transistor 112 may be coupled between the first transistor 110 and the respective LBL (e.g., LBL[0]). In some embodiments, the first and second transistors 110 and 112 may be NMOS transistors.

The merge circuitry 102 may include a multiplexer 114, e.g., formed by transistors 116*a-d*. In some embodiments, the transistors 116*a-d* may be NMOS transistors. The multiplexer 114 may selective couple one of the LBLs to a LBL merge node (LBL_MRG). For example, the transistors 116*a-d* may be coupled between the LBL merge node and the respective LBLs, and may receive a respective bundle select signal (e.g., Bundle_sel[ ]) at the gate terminal to turn the transistors 116*a-d* on and off. In embodiments, the bundle select signals may be static and unclocked, since the read word line signals are already clocked.

The merge circuitry 102 may further include read circuitry 117 to read the data from the selected LBL. The read circuitry may include a precharge circuitry 118 and a keeper circuitry 120 (also referred to as a keeper stack). In some embodiments, the keeper circuitry 120 may be driven by a feed forward inverter 122. The precharge circuitry 118 may include a precharge transistor 124 coupled between the LBL merge node and a supply rail 126. The precharge transistor 124 may receive a precharge signal at its gate terminal to control the precharge transistor 124 (e.g., for the precharge operation to selectively precharge the LBL merge node). The keeper circuitry 120 may include transistors 128*a-c* coupled in series between the LBL merge node and the supply rail 126 (e.g., in a keeper stack arrangement). The gate terminal of transistor 128*a* may be coupled to a read bit line (rdb10). An input of the feed forward inverter 122 may be coupled to the LBL merge node, and an output of the feed forward inverter 122 may be coupled to the read bit line (rb10).

In some embodiments, the read circuitry 117 may further include a transistor 130 with a gate terminal coupled to the read bit line and a source/drain terminal coupled to a global bit line (GBL). The transistor 130 may selectively pull down the GBL based on a value of the read bit line (rdb10).

The configuration of the merge circuitry 102 depicted in FIG. 1 is presented as an example, and other configurations may be used in accordance with various embodiments herein. For example, different configurations of the read circuitry 117 (e.g., precharge circuitry 118, keeper circuitry 120) and/or multiplexer 114 may be used in accordance with various embodiments.

In embodiments, any suitable number, n, of bitcells 104 may be coupled to each LBL, such as 32, 64, or another suitable number of bitcells. Additionally, while FIG. 1 depicts four LBLs coupled to the multiplexer 114 of the merge circuitry 102, any suitable number of two or more LBLs may be combined via the merge circuitry 102, such as four, eight, or another suitable number of LBLs. The combination of multiple LBLs via the multiplexer 114 enables the same precharge circuitry 118 and keeper circuitry 120 to be used for all of the bitcells 104, effectively reducing the number of precharge circuitries and keeper circuitries that are needed for a memory array and thereby reducing the area.

Figure 2:
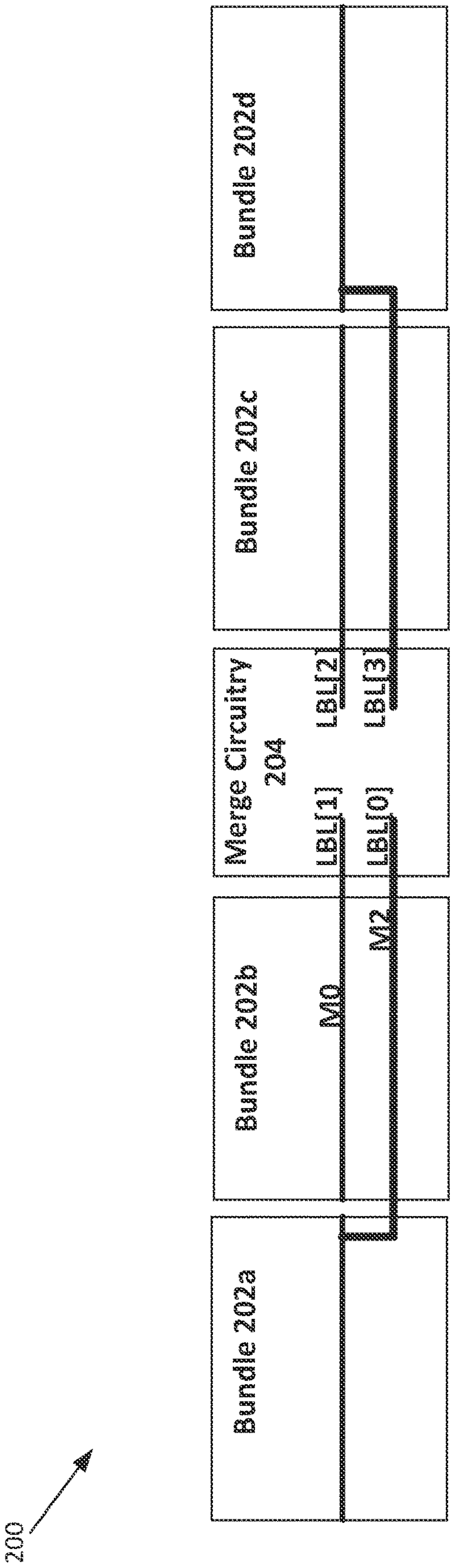
FIG. 2 illustrates an example of local bitline (LBL) routing in RF circuitry, in accordance with various embodiments.

In embodiments, the RF circuitry 100 may use a flying bitline arrangement in which the LBLs are disposed in different metal layers of the integrated circuit. For example, FIG. 2 schematically illustrates one example implementation for a RF circuitry 200 that may correspond to RF circuitry 100. The RF circuitry 200 includes a plurality of bundles 202*a-d* of bitcells that are coupled to a merge circuitry 204 via respective LBLs (e.g., LBL[0], LBL[1], LBL[2], and LBL[3]). The bitlines for the bundles 202*a-d* of bitcells that are closer to the merge circuitry 204, e.g., LBL[1] and LBL[2], may be routed in a lower metal layer, such as M0 (or another metal layer), since these bitlines are relatively short. The bitlines for the bundles 202*a-d* of bitcells that are farther away from the merge circuitry, e.g., LBL[0] and LBL[3] for bundles 202*a* and 202*d*, respectively, are longer and may have to "fly over" (e.g., overlap) the other bitlines (e.g., LBL[1] and LBL[2]). Accordingly, these bitlines (e.g., LBL[0] and LBL[3]) may use a higher metal layer, such as M2 (or another metal layer), or a combination of layers such as M0+M2 (e.g., as shown in FIG. 1).

The metal layers depicted in FIG. 2 are merely examples, and other metal layers may be used in accordance with various embodiments herein. For example, the choice of metal layers may be determined by the relative contribution of resistance (R) and capacitance (C) to the total delay of the RF circuitry 200.

As discussed above, embodiments herein include a unique procedure for performing a read operation on the RF circuitry. The read procedure may provide energy saving and/or performance advantages compared with prior techniques. In embodiments, the read procedure may be controlled by a control circuitry (e.g., control circuitry 101 of FIG. 1), which may be included in a memory controller and/or other suitable circuitry.

Figure 3:
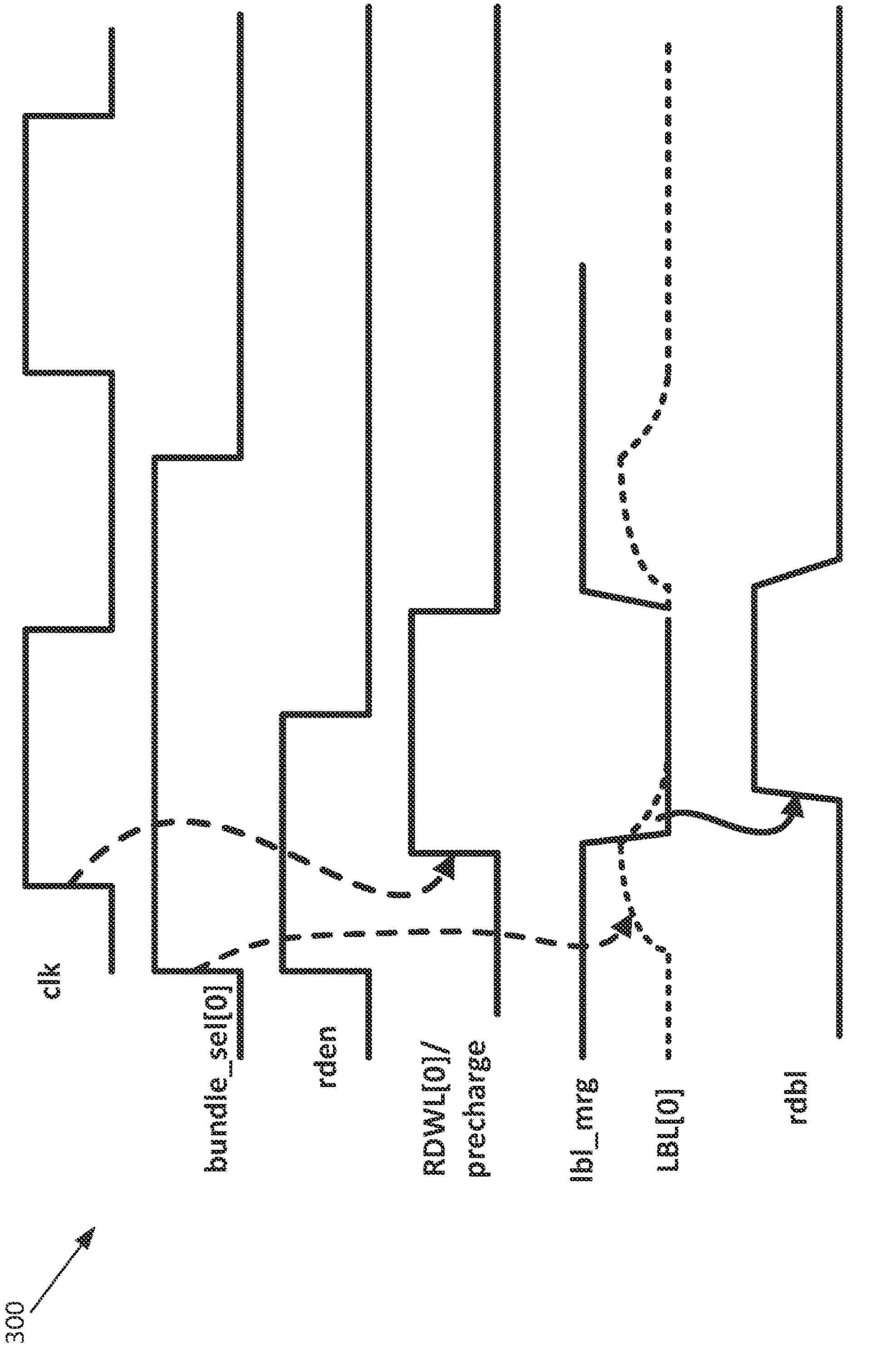
FIG. 3 illustrates waveforms of example signals during a precharge phase and an evaluate phase used to read data from a memory cell of the RF circuitry, in accordance with various embodiments.

FIG. 3 illustrates example waveforms 300 during a precharge phase and an evaluate phase of a read procedure in accordance with various embodiments. For example, the waveforms 300 depicted in FIG. 3 include a clock signal (clk), a bundle select signal (Bundle_sel[0]), a read enable signal (rden), an LBL signal (LBL[0]), a LBL merge signal (LBL_MRG) at the LBL merge node, a read word line signal (RDWL[0]), a precharge signal (precharge), and read bit line (rb1) signal. Note that the read word line signal and precharge signal may be aligned with one another and are illustrated in FIG. 3 as the same signal. However, in some embodiments, the read wordline and precharge signal may be implemented as two separate signals (e.g., a read wordline signal provided to the respective read word line and a precharge signal provided to the precharge transistor).

During standby (e.g., at steady state when no read operation is being done), all LBLs may be in a floating state except one (e.g., the LBL from the last read). This provides a significant reduction of leakage current through the bitcell read pulldown devices (e.g., transistors 108 and 110 of FIG. 1).

During the precharge phase, the LBL_MRG node is precharged through the precharge devices (e.g., precharge transistor 124 may be turned on responsive to the precharge signal). All the bundle select signals are off except one from the previous read. Just before the end of the precharge phase, the bundle select signal of the LBL to be read next (e.g., bundle_sel[0] turns on and the LBL node corresponding to that bundle (e.g., LBL[0]) is precharged. For example, the LBL node may be precharged to a supply voltage, Vcc, minus a transistor threshold voltage, Vtn. Additionally, the read enable signal is asserted to prepare a sense amplifier and/or other evaluation circuitry.

When the bundle select signal corresponding to the present read operation is turned on, the bundle select signal corresponding to the previous read operation may be turned off. There may be a setup requirement to charge the accessed LBL (e.g., to Vcc-Vtn) before the corresponding read word line (RDWL) turns on. In embodiments, the read address decoder can be designed such that the address setup requirement due to the bundle selection is similar to or better than the setup imposed by the read wordline signal (RDWL[0]).

The process may transition from the precharge phase to the evaluate phase responsive to a transition (e.g., rising edge or falling edge) of the clock signal (clk). In the evaluate phase, the read wordline signal on the RDWL to be read rises, and the precharge device is turned off. If the value to be read is a logic 1, both the LBL being accessed and the LBL merge node (LBL_MRG) are pulled down to the ground (e.g., as shown in FIG. 3). If the value to be read is a logic 0, the read wordline signal rises but the selected LBL stays charged (e.g., to VCC-Vtn) and LBL merge node also stays charged (e.g., to VCC) from the prior precharge phase. The output signal (rdb1) at the read bit line (e.g., output of inverter 122) is driven by the value of the LBL_MRG node (with logic inversion from inverter 122), which controls the pull-down transistor 130 coupled to the global bit line. The read enable signal then transitions, which causes the logic value of the bit to be evaluated (e.g., by a sense amplifier and/or other evaluation circuitry).

If another bit is read from the same bundle of bitcells, the corresponding bundle select signal remains high during the next read operation. If the next read operation happens from a different bundle, the bundle select signals switch to read from that bundle. The bundle select signals may be data signals decoded from high order address bits and dynamic power consumption based on the switching activity is low.

Embodiments herein may provide many improvements over prior techniques, including improvements to area, leakage, performance, and/or dynamic power. For example, there are several factors that positively impact area (e.g., reduce the area used by the RF circuitry). For example, the RF circuitry described herein reduces the number of read precharge and keeper circuits in the array by a multiple of the number of bundles that are combined by the merge circuitry (e.g., 4X for 4 bundles). In some implementations, the read precharge and keeper circuit contributes 16-18% of the area of an array bundle, so the reduction in the number of read precharge and keeper circuits has a material impact on the overall array area.

Additionally, the RF circuitry described herein may use more NMOS transistors in the merge circuitry than prior techniques, e.g., due to the NMOS transistors of the multiplexer. It may also reduce the number of PMOS transistors in a merge circuitry by using only one set of precharge and keeper devices. The number of NMOS and PMOS transistors in this implementation may therefore be more balanced. For example, assuming a 4-stack keeper design, the read circuitry of the merge circuitry 102 may include 6 PMOS transistors and 6 NMOS transistors (including the transistors of the feedforward inverter), resulting in a P/N ratio of 1. In contrast, a traditional read circuit may include 12 PMOS transistors and 3 NMOS transistors, resulting in a P/N ratio of 4. A balanced P/N transistor count allows for more efficient layout and smaller circuit area for the merge circuitry in current diffusion and future gridded process technologies.

Furthermore, the RF circuitry described herein may include fewer number of pull down transistors on the GBL, which may lead to a reduction of a logic stage downstream.

The RF circuitry and associated techniques described herein may also provide reduced leakage compared with prior techniques. For example, in the standby state, when no read operation is being done, the LBL_MRG node in FIG. 1 may be precharged to VCC, and the LBLs may be either precharged to VCC-Vtn or have been previously discharged. All but one bundle select signal may be held at Vss, which selects one of the bundles to be read from. As a result, the leakage in the RF circuitry is dramatically lower than a design with only a 2-stack read (which would omit the multiplexer).

Additionally, although a 3-stack read would typically be slower than a traditional 2-stack, there are a number of reasons why the performance the RF circuitry described herein is actually the same or faster than the traditional design. For example, the node with the larger capacitance, the LBL, is held at Vcc-Vtn (not Vcc) and is discharged through only 2 stacks, while the node with the smaller capacitance e.g., LBL_MRG, is discharged through the full 3 stacks. By contrast in a traditional design, although all the capacitance is being discharged through 2 stacks, the entire capacitance of the read bitline is precharged at the full Vcc. Additionally, the lower leakage of the RF circuitry described herein allows for use of lower Vt transistors on both the read stack and on the multiplexer to considerably speed up the circuitry and still end up with a net drop in leakage compared with prior techniques. Furthermore, the scheme described herein may enable a larger number of bitcells to be combined with a same read merge circuitry. This has the potential to speed-up downstream stages by either reducing the number of GBL pull-downs, or even eliminating an entire stage of logic.

The majority of the capacitance in this design e.g., LBL is charged only to Vcc-Vtn (where Vtn is the threshold voltage of the bundle select transistor of the multiplexer), and a smaller portion of the capacitance is charged to Vcc. Contrast this with a traditional design where the entire capacitance of the LBL is charged to Vcc. As a result, the read dynamic capacitance (Cdyn) for the RF circuitry described herein is lower than the traditional implementation.

Testing Results (e.g., power, performance, area (PPA) analysis)

Some testing results for example implementations are described further below. These results are merely examples and not intended to limit any embodiments herein.

Area: Rigorous area analysis studies were performed across various array sizes (e.g., 64-512 entries X 24-88 bits data width) in cutting edge technology node. The results indicated a 5-8% macro level area savings for the techniques described herein compared to the baseline design utilizing a 1R1 W bitcell as shown in Table 1 (below).

Leakage: In a comparison of leakage power, it was found that the technique described herein provides 3X leakage power saving compared to the baseline design. The read leakage current of whole slice is estimated for the average leakage case where half the bitcells store 0's and the other half store 1's. In the merge circuitry described herein, one of the bundle_sel signal is ON while the others are OFF.

Table 1 show the PPA and Vmin improvement of mega-merge over a traditional merge design. These numbers are from simulation of 1R1 W bitslice with fully extracted layout in a sub-10 nm technology node. The circuit contains LBL, merge, GBL, set dominant latch (SDL) and an output driver (e.g., inverter).

Performance: Timing delay is measured from the read wordline rising edge to the read data latch output driver falling edge. For the mega-merge circuit, the LBLs are initialized to Vcc to simulate a pessimistic delay. In actual silicon this node will typically be precharged only to Vcc-Vtn. There is a 7-11% performance improvement if it is assumed that LBLs only precharge to Vcc-Vtn as shown in Table 1.

TABLE 1

| | | Timing improvement (Vcc = 0.65 V) | | | | |
|---|---|---|---|---|---|---|
| Bitslice configuration | Area savings | LBL initialized to VCC | LBL initialized to VCC-Vtn | Leakage improvement as % of traditional | Performance Read Vmin improvement | Noise Read Vmin improvement |
| 512 entries | 7.0% | −0.2% | 6.8% | 14.58% | 15 mV | −25 mV |
| 256 entries (GBL pulldown, SDL) | 6.8% | 2.2% | 9.6% | 18.21% | 15 mV | −25 mV |
| 256 entries (RDL) | 8.5% | 0.0% | 7.4% | 20.43% | 15 mV | −25 mV |
| 128 entries | 10.1% | 3.3% | 11.1% | 31.82% | 15 mV | −25 mV |

Dynamic power: Table 2 shows the read dynamic power improvement due to mega merge over traditional design because majority of the capacitance (e.g., LBL[ ]) is only charged to Vcc-Vtn.

TABLE 2

| | Mux merge 128 entry | Traditional 64 entry | % improvement |
|---|---|---|---|
| RMS Read Current (a.u) | 3.06 | 3.59 | 15% |

Vmin and noise immunity: The results show that read Vmin (e.g., read '1') is significantly improved by the techniques herein. The noise Vmin (e.g., read '0') may be somewhat worse than the traditional merge technique (e.g., by 25 mV in the experimental results). If noise Vmin degradation is a concern, then the size of the transistors used in the keeper circuitry can be increase, at the cost of some read performance.

Accordingly, the read merge circuitry described herein is an effective technique to drive significant improvements to RF power, performance, area, and Vmin. In advanced process nodes, as keepers continue to be increasingly stacked for improving performance and Vmin, and as transition regions grow between foundry bitcells and read merge, the area allocated to read merge keeps growing. Accordingly, the techniques described herein are expected to become even more valuable for area savings in the future.

Example System

Figure 4:
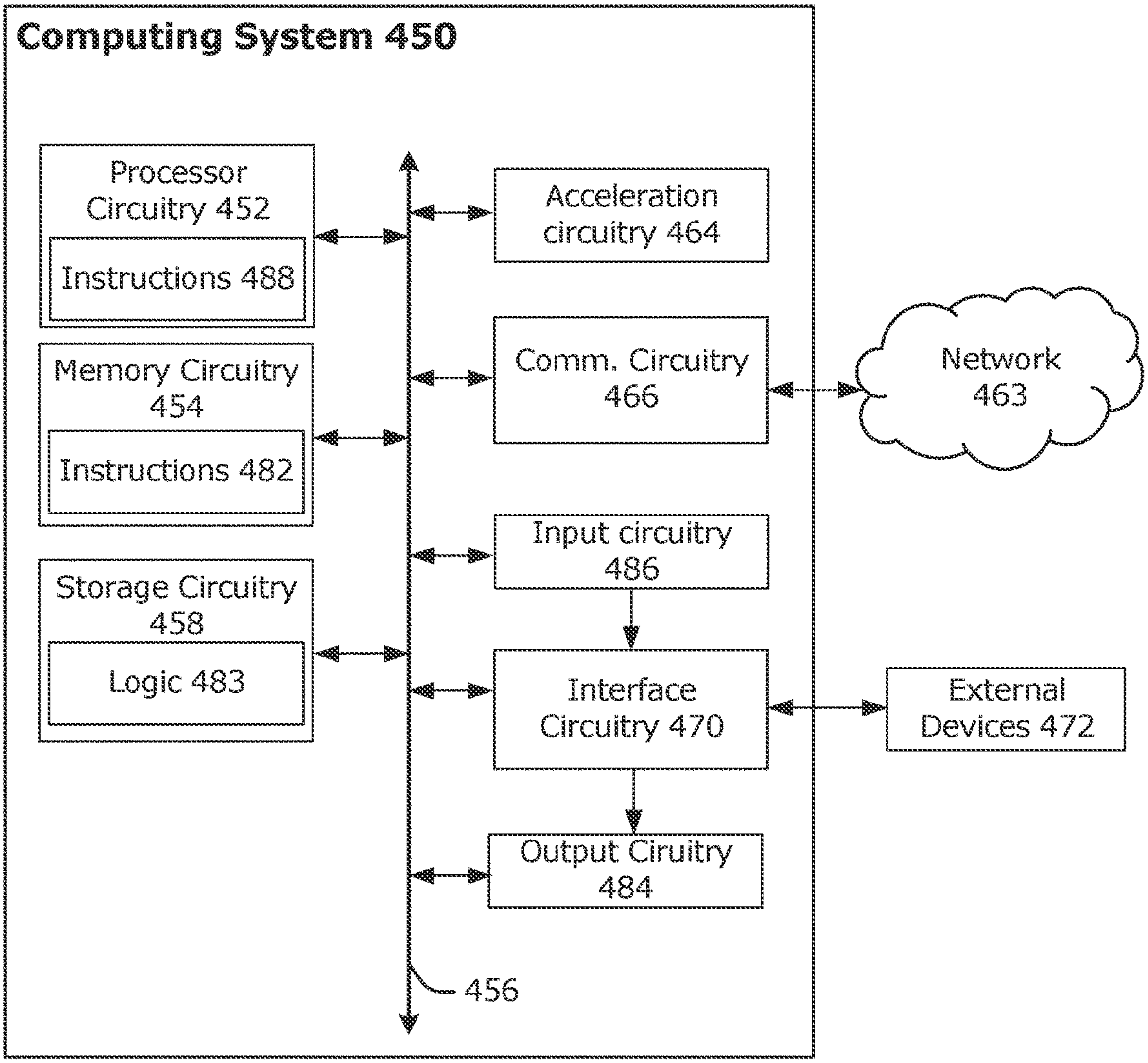
FIG. 4 illustrates an example system configured to employ the apparatuses and methods described herein, in accordance with various embodiments.

FIG. 4 illustrates an example of components that may be present in a computing system 450 for implementing the techniques described herein. The computing system 450 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 450, or as components otherwise incorporated within a chassis of a larger system. For one embodiment, at least one processor 452 may be packaged together with computational logic 482 and configured to practice aspects of various example embodiments described herein to form a System in Package (SiP) or a System on Chip (SoC).

The system 450 includes processor circuitry in the form of one or more processors 452. The processor circuitry 452 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 452 may include one or more hardware accelerators (e.g., same or similar to acceleration circuitry 464), which may be microprocessors, programmable processing devices (e.g., FPGA, ASIC, etc.), or the like. The one or more accelerators may include, for example, computer vision and/or deep learning accelerators. In some implementations, the processor circuitry 452 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 452 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 452 may be coupled with or may include memory/storage and may be configured to execute instructions stored in the memory/storage to enable various applications or operating systems to run on the platform 450. The processors (or cores) 452 is configured to operate application software to provide a specific service to a user of the platform 450. In some embodiments, the processor(s) 452 may be a special-purpose processor(s)/controller(s) configured (or configurable) to operate according to the various embodiments herein.

As examples, the processor(s) 452 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 452 may be a part of a system on a chip (SoC), System-in-Package (SiP), a multi-chip package (MCP), and/or the like, in which the processor(s) 452 and other components are formed into a single integrated circuit, or a single package. Other examples of the processor(s) 452 are mentioned elsewhere in the present disclosure.

The system 450 may include or be coupled to acceleration circuitry 464, which may be embodied by one or more artificial intelligence (AI)/machine learning (ML) accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 464 may comprise logic blocks or logic fabric and other interconnected resources that may be programmed (configured) to perform various functions, such as the procedures, methods, functions, etc. of the various embodiments discussed herein. In such implementations, the acceleration circuitry 464 may also include memory cells (e.g., EPROM, EEPROM, flash memory, static memory (e.g., SRAM, antifuses, etc.) used to store logic blocks, logic fabric, data, etc. in LUTs and the like.

In some implementations, the processor circuitry 452 and/or acceleration circuitry 464 may include hardware elements specifically tailored for machine learning and/or artificial intelligence (AI) functionality. In these implementations, the processor circuitry 452 and/or acceleration circuitry 464 may be, or may include, an AI engine chip that can run many different kinds of AI instruction sets once loaded with the appropriate weightings and training code. Additionally or alternatively, the processor circuitry 452 and/or acceleration circuitry 464 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel™ Corp., Intel™ Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 452 and/or acceleration circuitry 464 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited™, the Neural Engine core within the Apple® A11 or A12 Bionic SoC, the Neural Processing Unit (NPU) within the HiSilicon Kirin 470 provided by Huawei®, and/or the like. In some hardware-based implementations, individual subsystems of system 450 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 450 also includes system memory 454. Any number of memory devices may be used to provide for a given amount of system memory. As examples, the memory 454 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 454 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 454 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 458 provides persistent storage of information such as data, applications, operating systems and so forth. In an example, the storage 458 may be implemented via a solid-state disk drive (SSDD) and/or high-speed electrically erasable memory (commonly referred to as "flash memory"). Other devices that may be used for the storage 458 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 454 and/or storage circuitry 458 may also incorporate three-dimensional (3D) cross-point (XPOINT) memories from Intel™ and Micron™.

The memory circuitry 454 and/or storage circuitry 458 is/are configured to store computational logic 483 in the form of software, firmware, microcode, or hardware-level instructions to implement the techniques described herein. The computational logic 483 may be employed to store working copies and/or permanent copies of programming instructions, or data to create the programming instructions, for the operation of various components of system 400 (e.g., drivers, libraries, application programming interfaces (APIs), etc.), an operating system of system 400, one or more applications, and/or for carrying out the embodiments discussed herein. The computational logic 483 may be stored or loaded into memory circuitry 454 as instructions 482, or data to create the instructions 482, which are then accessed for execution by the processor circuitry 452 to carry out the functions described herein. The processor circuitry 452 and/or the acceleration circuitry 464 accesses the memory circuitry 454 and/or the storage circuitry 458 over the interconnect (IX) 456. The instructions 482 direct the processor circuitry 452 to perform a specific sequence or flow of actions, for example, as described with respect to flowchart(s) and block diagram(s) of operations and functionality depicted previously. The various elements may be implemented by assembler instructions supported by processor circuitry 452 or high-level languages that may be compiled into instructions 481, or data to create the instructions 481, to be executed by the processor circuitry 452. The permanent copy of the programming instructions may be placed into persistent storage devices of storage circuitry 458 in the factory or in the field through, for example, a distribution medium (not shown), through a communication interface (e.g., from a distribution server (not shown)), over-the-air (OTA), or any combination thereof.

The IX 456 couples the processor 452 to communication circuitry 466 for communications with other devices, such as a remote server (not shown) and the like. The communication circuitry 466 is a hardware element, or collection of hardware elements, used to communicate over one or more networks 463 and/or with other devices. In one example, communication circuitry 466 is, or includes, transceiver circuitry configured to enable wireless communications using any number of frequencies and protocols such as, for example, the Institute of Electrical and Electronics Engineers (IEEE) 802.11 (and/or variants thereof), IEEE 802.7.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 466 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 456 also couples the processor 452 to interface circuitry 470 that is used to connect system 450 with one or more external devices 472. The external devices 472 may include, for example, sensors, actuators, positioning circuitry (e.g., global navigation satellite system (GNSS)/ Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 450, which are referred to as input circuitry 486 and output circuitry 484 in FIG. 4. The input circuitry 486 and output circuitry 484 include one or more user interfaces designed to enable user interaction with the platform 450 and/or peripheral component interfaces designed to enable peripheral component interaction with the platform 450. Input circuitry 486 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 484 may be included to show information or otherwise convey information, such as sensor readings, actuator position(s), or other like information. Data and/or graphics may be displayed on one or more user interface components of the output circuitry 484. Output circuitry 484 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 450. The output circuitry 484 may also include speakers and/or other audio emitting devices, printer(s), and/or the like. Additionally or alternatively, sensor(s) may be used as the input circuitry 484 (e.g., an image capture device, motion capture device, or the like) and one or more actuators may be used as the output device circuitry 484 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 450 may communicate over the IX 456. The IX 456 may include any number of technologies, including ISA, extended ISA, I2C, SPI, point-to-point interfaces, power management bus (PMBus), PCI, PCIe, PCIx, Intel™ UPI, Intel™ Accelerator Link, Intel™ CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 456 may be a proprietary bus, for example, used in a SoC based system.

The number, capability, and/or capacity of the elements of system 400 may vary, depending on whether computing system 400 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 400 may comprise one or more components of a data center, a desktop computer, a workstation, a laptop, a smartphone, a tablet, a digital camera, a smart appliance, a smart home hub, a network appliance, and/or any other device/system that processes data.

EXAMPLES

Some non-limiting examples of various embodiments are provided below.

Example 1 is a circuit comprising: a plurality of sets of memory cells, wherein individual sets of memory cells of the plurality of sets of memory cells are coupled to a respective local bit line (LBL); a multiplexer with inputs coupled to the respective LBLs, wherein the multiplexer is to couple a selected one of the LBLs to a LBL merge node, wherein the selected LBL is coupled to a first set of memory cells of the plurality of memory cells; and read circuitry coupled to the LBL merge node to read data from a first memory cell of the first set of memory cells via the selected LBL.

Example 2 is the circuit of example 1, wherein the multiplexer includes respective transistors coupled between the respective inputs of the multiplexer and LBL merge node.

Example 3 is the circuit of example 1 or 2, wherein the read circuitry includes a precharge circuitry and a keeper circuitry coupled to the LBL merge node.

Example 4 is the circuit of any of examples 1-3, wherein the LBLs for the respective sets of memory cells are in at least two metal layers of the circuit.

Example 5 is the circuit of any of examples 1-4, wherein all of the LBLs except one are kept in a floating state between read operations.

Example 6 is the circuit of any of examples 1-5, wherein, to read the data from the first memory cell, the read circuitry is to precharge the selected LBL via the multiplexer while the other LBLs are maintained in the floating state.

Example 7 is the circuit of example 6, wherein the selected LBL is precharged to a voltage that corresponds to a supply voltage, Vcc, minus a transistor threshold voltage, Vt.

Example 8 is the circuit of any of examples 5-7, wherein, to read the data from the first memory cell, a read word line coupled between the first memory cell is turned on after the selected LBL is precharged.

Example 9 is the circuit of any of examples 1-8, further comprising one or more processor cores, wherein the memory cells correspond to cache memory for the one or more processor cores.

Example 10 is a circuit comprising: read merge circuitry and control circuitry coupled to the read merge circuitry. The read merge circuitry includes: keeper circuitry and precharge circuitry coupled to a merge node; a plurality of bundle select transistors, wherein individual bundle select transistors are coupled between the LBL merge node and respective local bitlines (LBLs) of a plurality of LBLs. To read data from a first bitcell that is coupled to a first LBL of the plurality of LBLs, the control circuitry is to: precharge the merge node via the precharge circuitry; turn on the bundle select transistor that is coupled to the first LBL to precharge the first LBL; and activate a read word line associated with the first bitcell after the first LBL is precharged.

Example 11 is the circuit of example 10, wherein the merge node is precharged to first voltage and the first LBL is precharged to a second voltage that is less than the first voltage.

Example 12 is the circuit of example 10 or 11, wherein the first bitcell is included in a bundle of bitcells that are coupled to the first LBL.

Example 13 is the circuit of any of examples 10-12, wherein the other bundle select transistors are off while the bundle select transistor that is coupled to the first LBL is on.

Example 14 is the circuit of any of examples 10-13, wherein the LBLs other than the first LBL are kept in a floating state while the data from the bitcell is read.

Example 15 is the circuit of any of examples 10-14, wherein the LBLs are in at least two metal layers of the circuit.

Example 16 is the circuit of any of examples 10-15, wherein the bundle select transistor remains on until a subsequent read operation associated with a different bundle select transistor.

Example 17 is a system comprising: one or more processor cores; and memory circuitry to provide a cache memory for the one or more processor cores. The memory circuitry includes: a plurality of sets of bitcells, wherein individual sets of bitcells are coupled to a respective local bit line (LBL) of a plurality of LBLs; and read merge circuitry. The read merge circuitry includes: keeper circuitry and precharge circuitry coupled to a merge node; and a multiplexer coupled between the merge node and the plurality of LBLs, wherein, for a read operation to read data from a first bitcell that is coupled to a first LBL of the plurality of LBLs, the multiplexer is to selectively couple the first LBL to the read merge node and keep the other LBLs in a floating state.

Example 18 is the system of example 17, further comprising control circuitry, wherein, for the read operation, the control circuitry is to: precharge the merge node, via the precharge circuitry, to a first voltage; and control the multiplexer to selectively couple the first LBL to the read merge node to precharge the first LBL to a second voltage that is less than the first voltage.

Example 19 is the system of example 18, wherein the first bitcell is coupled to a first LBL via a transistor that is controlled by a read word line, and wherein the control circuitry is further to activate the read word line to turn on the transistor after the first LBL is precharged.

Example 20 is the system of any of examples 17-20, further comprising one or more of a power supply interface, a communication interface, or a display coupled to the one or more processor cores.

In the preceding detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit comprising:

a plurality of sets of memory cells, wherein individual sets of memory cells of the plurality of sets of memory cells are coupled to a respective local bit line (LBL);

a multiplexer with inputs coupled to the respective LBLs, wherein the multiplexer is to couple a selected one of the LBLs to a LBL merge node, wherein the selected LBL is coupled to a first set of memory cells of the plurality of memory cells; and read circuitry coupled to the LBL merge node to read data from a first memory cell of the first set of memory cells via the selected LBL, wherein, to read the data from the first memory cell, (i) the read circuitry is to precharge the selected LBL via the multiplexer while the other LBLs are maintained in a floating state, and (ii) a read word line for the first memory cell is turned on after the selected LBL is precharged.

2. The circuit of claim 1, wherein the multiplexer includes respective transistors coupled between the respective inputs of the multiplexer and LBL merge node.

3. The circuit of claim 1, wherein the read circuitry includes a precharge circuitry and a keeper circuitry coupled to the LBL merge node.

4. The circuit of claim 1, wherein the LBLs for the respective sets of memory cells are in at least two metal layers of the circuit.

5. The circuit of claim 1, wherein all of the LBLs except one are kept in a floating state between read operations.

6. The circuit of claim 1, wherein the selected LBL is precharged to a voltage that corresponds to a supply voltage, Vcc, minus a transistor threshold voltage, Vt.

7. The circuit of claim 1, further comprising one or more processor cores, wherein the memory cells correspond to cache memory for the one or more processor cores.

8. A circuit comprising:

read merge circuitry including:

keeper circuitry and precharge circuitry coupled to a merge node; and a plurality of bundle select transistors, wherein individual bundle select transistors are coupled between the LBL merge node and respective local bitlines (LBLs) of a plurality of LBLs; and control circuitry coupled to the read merge circuitry, wherein, to read data from a first bitcell that is coupled to a first LBL of the plurality of LBLs, the control circuitry is to:

precharge the merge node via the precharge circuitry;

turn on the bundle select transistor that is coupled to the first LBL to precharge the first LBL; and activate a read word line associated with the first bitcell after the first LBL is precharged.

9. The circuit of claim 8, wherein the merge node is precharged to first voltage and the first LBL is precharged to a second voltage that is less than the first voltage.

10. The circuit of claim 8, wherein the first bitcell is included in a bundle of bitcells that are coupled to the first LBL.

11. The circuit of claim 8, wherein the other bundle select transistors are off while the bundle select transistor that is coupled to the first LBL is on.

12. The circuit of claim 8, wherein the LBLs other than the first LBL are kept in a floating state while the data from the bitcell is read.

13. The circuit of claim 8, wherein the LBLs are in at least two metal layers of the circuit.

14. The circuit of claim 8, wherein the bundle select transistor remains on until a subsequent read operation associated with a different bundle select transistor.

15. A system comprising:

one or more processor cores; and memory circuitry to provide a cache memory for the one or more processor cores, wherein the memory circuitry includes:

a plurality of sets of bitcells, wherein individual sets of bitcells are coupled to a respective local bit line (LBL) of a plurality of LBLs; and read merge circuitry including:

keeper circuitry and precharge circuitry coupled to a merge node; and a multiplexer coupled between the merge node and the plurality of LBLs, wherein, for a read operation to read data from a first bitcell that is coupled to a first LBL of the plurality of LBLs, the multiplexer is to selectively couple the first LBL to the read merge node and keep the other LBLs in a floating state, and a read word line for the first memory cell is turned on after the selected LBL is precharged.

16. The system of claim 15, further comprising control circuitry, wherein, for the read operation, the control circuitry is to:

precharge the merge node, via the precharge circuitry, to a first voltage;

control the multiplexer to selectively couple the first LBL to the read merge node to precharge the first LBL to a second voltage that is less than the first voltage.

17. The system of claim 16, wherein the first bitcell is coupled to a first LBL via a transistor that is controlled by a read word line, and wherein the control circuitry is further to activate the read word line to turn on the transistor after the first LBL is precharged.

18. The system of claim 15, further comprising one or more of a power supply interface, a communication interface, or a display coupled to the one or more processor cores.

* * * * *